United States Patent [19]

Bard et al.

[11] Patent Number: 5,378,307
[45] Date of Patent: Jan. 3, 1995

[54] FLUID TREATMENT APPARATUS

[75] Inventors: Steven L. Bard, Endwell; Gerald A. Bendz, Vestal; Michael J. Canestaro; John R. Chapura, both of Endicott; Edward J. Frankoski, Newark Valley; Michael S. Horan, Maine; Jeffrey D. Jones, Newark Valley; James S. Kamperman, Endicott; John R. Kjelgaard, Jr., Whitney Point; Jack M. McCreary, Apalachin, all of N.Y.

[73] Assignee: International Business Machines Corporation, Armonk, N.Y.

[21] Appl. No.: 54,108

[22] Filed: Apr. 28, 1993

[51] Int. Cl.⁶ ............................................. B08B 3/02
[52] U.S. Cl. .................................... 156/639; 156/640; 156/642; 156/345; 134/10; 134/15; 134/26; 134/64 R; 134/95.3; 134/103.1
[58] Field of Search ............... 156/639, 640, 642, 345; 134/10, 15, 26, 64 R, 72, 122 R, 172, 103.1, 103.2, 131, 151, 199, 198, 95.1, 95.3

[56] References Cited

U.S. PATENT DOCUMENTS

| | | | |
|---|---|---|---|
| 2,926,674 | 3/1960 | Umbricht et al. | 134/72 |
| 3,082,774 | 3/1963 | Benton et al. | 134/64 R X |
| 3,938,214 | 2/1976 | Hodsden et al. | 134/64 R X |
| 4,039,349 | 8/1977 | Kwasnoski et al. | 134/64 R X |
| 4,270,317 | 6/1981 | Kurie | 51/426 |
| 4,506,687 | 3/1985 | Rosch, III | 134/83 |
| 4,561,904 | 12/1985 | Eberhardt, Jr. | 134/72 X |
| 4,592,784 | 6/1986 | Ghizzi | 134/64 R X |
| 4,789,405 | 12/1988 | Blasing et al. | 134/1 |
| 4,798,218 | 1/1989 | Sauvan | 134/131 X |
| 4,938,257 | 7/1990 | Morris | 134/122 R X |
| 4,950,333 | 8/1990 | Hone et al. | 134/15 |
| 4,985,111 | 1/1991 | Ketelhohn | 156/640 |
| 5,007,445 | 4/1991 | Pender | 134/122 |
| 5,063,950 | 11/1991 | Kallweit et al. | 134/122 R X |
| 5,063,951 | 11/1991 | Bard et al. | 134/64 |
| 5,076,885 | 12/1991 | Haas et al. | 156/642 |
| 5,179,967 | 1/1993 | Mattiussi | 134/64 R X |
| 5,188,135 | 2/1993 | Neumann et al. | 134/122 R X |
| 5,240,018 | 8/1993 | Clark et al. | 134/64 R |
| 5,246,024 | 9/1993 | Uchino | 134/122 R X |

OTHER PUBLICATIONS

IBM Technical Disclosure Bulletin, vol. 18, No. 3, Aug. 1975, "Cascading Image Developer", by R. C. Ludden, pp. 690-691.

Primary Examiner—Thi Dang
Attorney, Agent, or Firm—Lawrence R. Fraley

[57] ABSTRACT

A fluid treatment apparatus and method for applying first and second fluids (e.g., etchant and water) to an article (e.g., circuit board) passing through the apparatus at a predetermined rate. The first fluid is impinged on a surface of the article and thereafter collected within the apparatus' common housing. The second fluid is impinged onto the surface of the article and collected within the same housing but at a location separate from the collected first fluid so as to at least partially prevent mixing thereof. The preferred means for effecting fluid impingement comprises separate fluid injectors, each including at least two rows of fluid jet injectors therein. The collected fluids are each returned to the respective impingement means. Replenishment of the second fluid is accomplished using a pump which supplies the second fluid, while the apparatus also includes means (e.g., a drain) to effectively remove the second fluid at a rate similar to the supply rate for the second fluid. The first fluid is also maintained at an established level above the article's surface using suitable means (e.g., dual rollers) located relative (e.g., on opposite sides of) the first fluid impingement means. Similar level retention for the second fluid is also possible. Cascading of the collected second fluid is also defined, this occurring within the same housing chamber which serves to collect the first fluid.

35 Claims, 4 Drawing Sheets

FLUID TREATMENT APPARATUS

The invention relates to the treatment of articles with fluids. More particularly, the invention relates to the treatment of articles such as substrates adapted for utilization in printed circuit boards or the like.

CROSS REFERENCE TO COPENDING APPLICATION

In Ser. No. (S.N.) 07/911,610, entitled "Fluid Treatment Apparatus and Method" (inventors: S. L. Bard et al), there is defined a fluid treatment apparatus and a method for treating a substrate with a fluid wherein strategically positioned rows of fluid jet injectors are used to assure that most of the fluid from one of the rows passes in a direction substantially opposite the direction of travel of the substrate being treated to thereby overcome potential problems associated with "fluid dragout" (passage of retained fluid from one station to the next). The plenum housings having such fluid injectors of this apparatus may be utilized in the present invention. This application is thus incorporated herein by reference. Ser. No. 07/911.610 was filed on Jul. 10, 1992, and is now U.S. Pat. No. 5,289,639.

BACKGROUND OF THE INVENTION

There are several types of fluid treatment apparatus known in the art, including such apparatus for treating, e.g., etching, printed circuit substrates. Examples of such apparatus are described in U.S. Pat. Nos. 4,270,317, 4,506,687, 4,985,111 and 5,076,885. In U.S. Pat. No. 4,270,317, to E. J. Kurie, there is defined an apparatus for treating metal sheets passed continuously through the apparatus wherein several successively positioned treatment tanks or units are used. The primary purpose of this apparatus is to rinse the metal sheets, using oppositely positioned spray nozzles which are oriented at a predetermined angular relationship to the direction of sheet travel to thereby maintain turbulent fluid flow against the sheet during rinse. This apparatus is of substantially elongated configuration, requiring use of significant space on the manufacturing floor. In U.S. Pat. No. 4,506,687, to H. J. Rosch, there is described an apparatus for etching and rinsing vertically oriented printed circuit boards with the various treatment stations located in successive, adjacent orientation, resulting in an overall apparatus substantially elongated configuration. Like the apparatus in U.S. Pat. No. 4,270,317, this apparatus also mandates use of significant space on the manufacturing floor. U.S. Pat. No. 4,985,111 to K. F. G. Ketelhohn, like U.S. Pat. No. 4,506,687, is also concerned with the treatment of printed circuit board substrates and utilizes angularly dispositioned spray nozzles to impinge the substrates at predetermined angles in order to prevent puddling or the like at certain locations on the substrate. This patent thus appears to require a relatively elongated sprayer structure for this singular operation, in turn mandating an even longer overall structure for the final apparatus configuration. Finally, in U.S. Pat. No. 5,076,885, to Haas et al, there is described an apparatus for processing (etching) metal workpieces, and in particular copper laminated printed circuit boards, wherein successively oriented "modules" are necessary, these being spacedly positioned with respect to one another. This apparatus thus possesses the same inherent disadvantages associated with those in the foregoing three other patents, that being the need to provide relatively substantial floor space to adequately accommodate the apparatus.

Although it is mentioned above that the invention is particularly adapted for use in the treatment of substrates for eventual use as a printed circuit board or the like, the invention is not to be so limited in that it may be utilized to perform a variety of different forms of treatment of several different types of articles passing therethrough, including both metallic and non-metalic. By the term treatment as used herein is thus meant to include processes such as coating, cleaning, chemically treating (e.g., etching), as well as others such as plating, as discernible from the teachings provided herein. Further, by the term fluid as used herein is meant to include both liquids (e.g., etchants, water) and gases (e.g., air).

The present invention provides an apparatus and method for treating substrates or similar articles with fluid wherein at least two different processes can be effectively performed in a relatively small amount of floor space, while simultaneously assuring effective utilization (e.g., recycling and replenishment) of the fluids utilized. Such an apparatus and method also requires use of minimum quantities of each fluid so used, while effectively performing the desired processes in the limited spacing utilized.

It is believed that such an apparatus and process would constitute a significant advancement in the art.

DISCLOSURE OF THE INVENTION

It is therefore, a primary object of the present invention to enhance the art of fluid treatment apparatus and methods wherein at least two fluids are applied to the article being treated.

It is another object of the invention to provide a fluid treatment apparatus and method wherein such dual treatment is carried out in a minimum amount of floor space while simultaneously assuring optimum utilization of the treatment fluids.

It is still another object of the invention to provide such an apparatus which is relatively inexpensive to produce and operate.

In accordance with one aspect of the invention, there is provided an apparatus for applying first and second fluids to an article passing therethrough, the apparatus comprising a housing defining a chamber therein, first fluid impingement means for impinging a first fluid onto a surface of the article, the first fluid thereafter being collected within the chamber of the housing, means for circulating the collected first fluid to the first fluid impingement means, second fluid impingement means for impinging a second fluid onto the surface of the article at a location substantially adjacent the location of impingement of the first fluid, means for collecting the impinged second fluid within the chamber of the housing separate from the collected first fluid, and means for providing second fluid to the second fluid impingement means.

In accordance with another aspect of the invention, there is provided a method for treating an article with fluids, wherein the method is accomplished by the steps of transporting the article through a housing defining a chamber therein, impinging a first fluid onto a surface of the article within the chamber, collecting the impinged first fluid within the chamber, impinging a second fluid onto the surface of the article at a location substantially adjacent the location of impingement of the first fluid, collecting the impinged second fluid within the chamber of the housing separate from the collected first fluid, and providing second fluid and thereafter impinging the second fluid onto the surface of the article.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
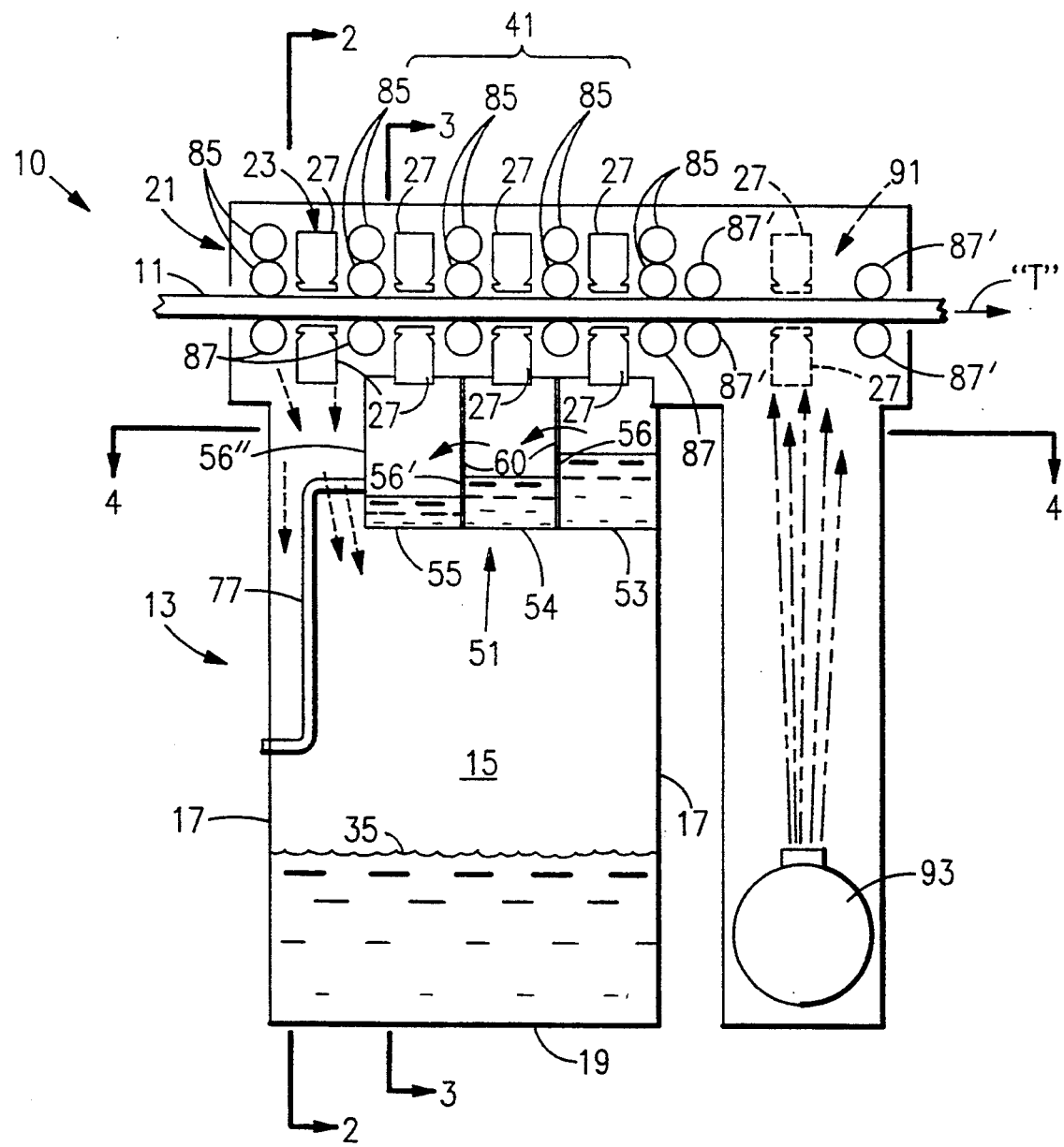
FIG. 1 is a front elevational view, partly in section, illustrating a fluid treatment apparatus in accordance with a preferred embodiment of the invention.

In FIG. 1 there is shown a fluid treatment apparatus 10 in accordance with a preferred embodiment of the invention. As understood from the following, apparatus 10 is capable of applying fluids to an article 11 (such as a substrate) in order to perform a desired function, e.g., etching, rinsing, etc. The invention is particularly adapted for applying etchants to the surface of a solid or apertured article, which will eventually comprise a printed circuit board or similar such element. A particular example of such an article comprised a dielectric (e.g., fiberglass reinforced epoxy resin) substrate having conductive (e.g., copper) circuitry thereon and/or therein. In such an example of an apertured version, the apertures may comprise plated through holes (PTHs). The invention, of course, may be used for performing many other types of processes, including relatively simple rinsing operations (e.g., with water), etc. In accordance with the particular teachings of the invention, apparatus 10 performs two separate fluid treatment operations on article 11 as the article passes through the common housing or container 13 thereof. As defined, two representative examples of such processes include an initial etching operation followed by a rinse to remove any remaining etchant from the initial operation. Significantly, both operations, utilizing, possibly two diverse fluids, are performed in a singular, common housing or container of the apparatus, thereby accomplishing these operations using a minimum of manufacturing floor space. Apparatus 10 may also be used to coat article 11 (e.g., with corrosion inhibitor) and then rinse the coated article to remove predetermined portions of the coating, if desired. Other combinations of operations capable of being accomplished by the invention are well within the scope of those versed in the art of fluid treatment and further description is not believed necessary. Housing 13 includes a chamber 15 defined therein by the illustrated, upstanding side walls 17 and a bottom (floor) 19. In the embodiment of housing 13 as depicted in the drawings, the housing is of substantially rectangular configuration (in both horizontal and vertical cross section), but it is understood that the invention is not limited to this particular configuration in that others (e.g., cylindrical) are possible.

Figure 2:
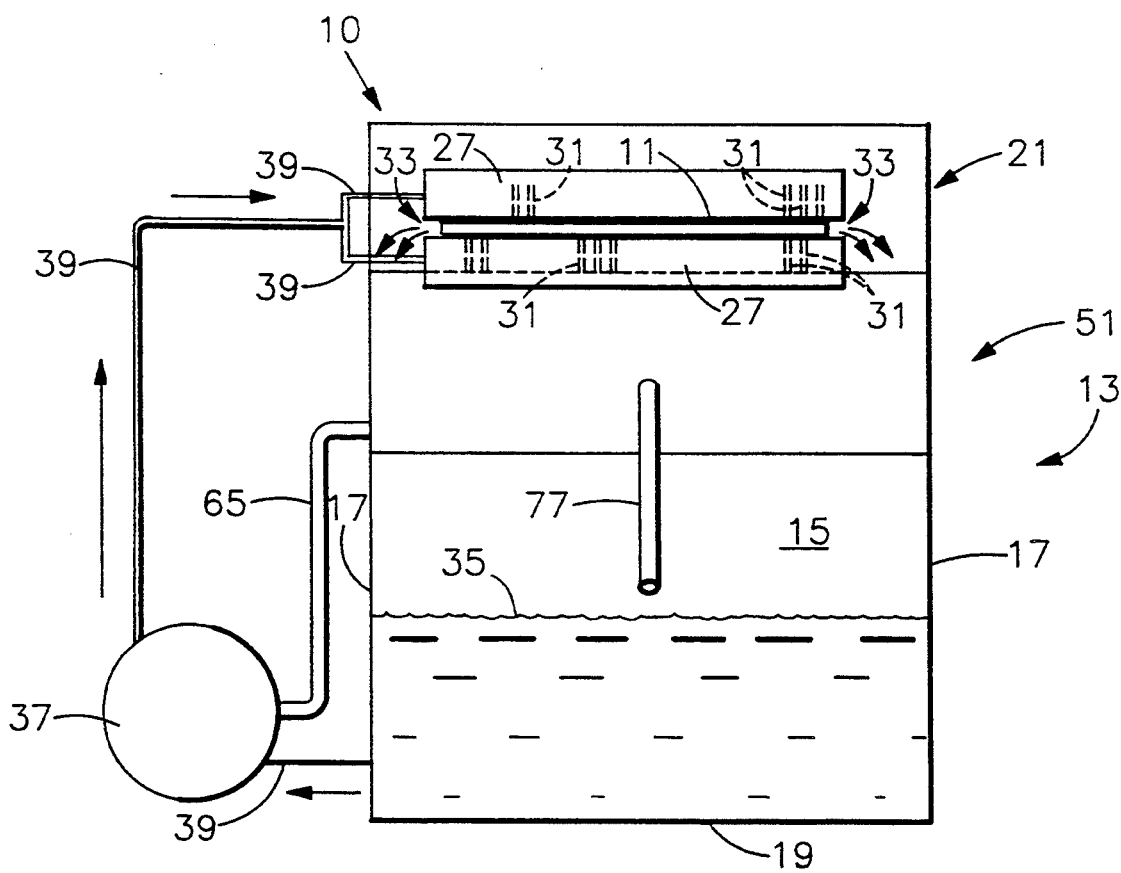
FIG. 2 is a side elevational view of the apparatus of FIG. 1, as taken along the line 2—2 in FIG. 1 and on a slightly reduced scale over the view in FIG. 1.
Figure 5:
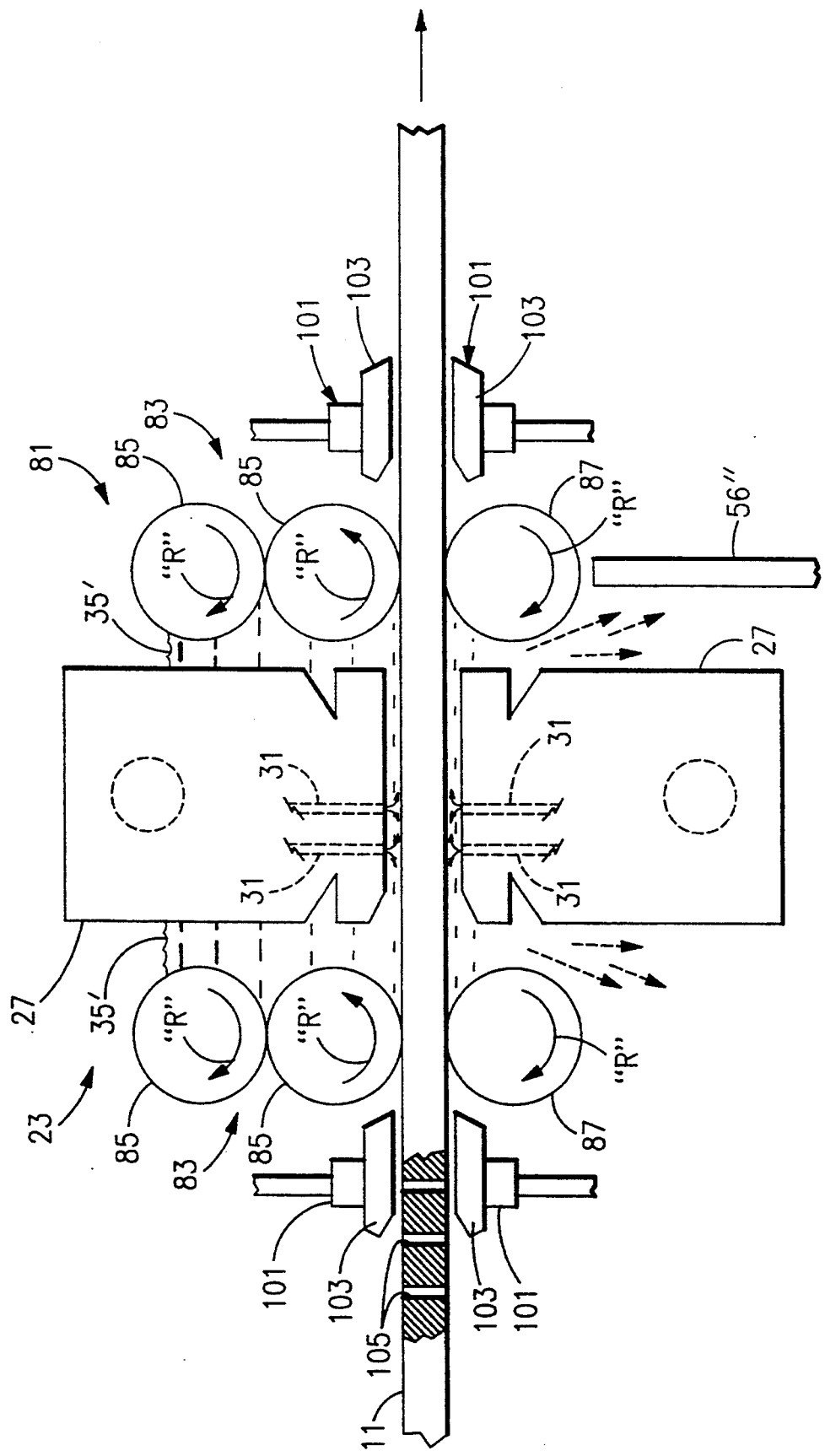
FIG. 5 is a side elevational view, greatly enlarged over the views in FIGS. 1-4, illustrating a preferred embodiment of the invention's fluid retaining roller assemblies as utilized in conjunction with a respective one of the invention's fluid dispensing devices.

Located in the upper portion 21 of housing 13 are the various fluid impingement means 23 and 41 for dispensing (impinging) the respective first and second fluids (e.g., etchant and water, respectively) onto article 11 as the article moves (e.g., horizontal) through this upper portion of the invention. The impingement means include at least one means 23 for impinging the first fluid (e.g., sodium persulfate etchant solution) onto at least one surface (e.g., the upper surface) of article 11. First fluid impingement means 23 preferably comprises a pair of elongated fluid injector members 27 (see also FIG. 2) which extend, preferably, substantially perpendicular to the direction of travel of article 11 ("T" in FIG. 1) and, as better seen in FIG. 5, are positioned a predetermined, slight distance from the respective opposed surfaces of article 11. Each of the elongated fluid injector members, as best seen in FIG. 2, are preferably longer than the corresponding width of article 11, such that the article is located therebetween as in the orientation shown in FIG. 2. Such orientation assures proper impingement of fluid onto the entire width of the respective article surface, if desired.

In a preferred embodiment of the invention, each of the first fluid impingement means (elongated fluid injector members 27) are of the type defined in the aforementioned, U.S. Pat. No. 5,289,639, the disclosure of which is incorporated herein by reference. As defined in U.S. Pat. No. 5,289,639, and as also seen in FIG. 5, each fluid injector member includes at least two rows of fluid jet injectors (apertures) 31 which extend substantially the length of the injector member's housing and which function to direct the preferred first fluid onto the respective, adjacent surface of article 11 at a prescribed rate. Utilization of such fluid injected members provides the several advantageous features defined in U.S. Pat. No. 5,289,639. Further description is thus not believed necessary. It must be noted, however, that the invention is not to be limited to the use of such fluid injector members in order to accomplish effective treatment in the manner prescribed herein. Other injectors or means for applying fluid in an effective manner, including known spray nozzles, fluid manifolds, or the like are readily possible for use in the present invention.

In one example of the invention, a flat dielectric substrate-copper circuitry article was transported through the invention and was treated using a pair of first fluid injector members 27 each having an overall length of about thirty-six inches and a corresponding, very narrow width (FIG. 1) of only about one inch, each of these spaced a distance of about 0.125 inch from the respective, adjacent surface of the article. In one example, members 27 were located at a distance of about 0.100 inch from the bottom surface of article 11 and from about 0.100-0.200 inch from the top surface. The greater upper distance compensates for variations in article thickness, the lower distance being fixed due to placement of the article on rollers (87, described below) during passage through apparatus 10.

As shown in FIGS. 1 and 2, the first fluid which impinges on article 11 passes out through the opposed open ends 33 of fluid injector members 27 and drops, by gravity, into the bottom of housing 13 where it is collected. Significantly, and as defined in greater detail herein below, this first fluid is substantially prevented from passing further into other parts of housing 13. Those relatively minor amounts of such fluid which do so pass are readily accommodated in accordance with the unique teachings herein.

Recirculation of the collected first fluid (35 in FIGS. 1 and 2) is preferably accomplished by a pump 37 and suitable piping means 39 which transport the collected fluid from the bottom of housing 13 and up to the respective, paired injectors 27. Although a pump 37 is shown as one means for accomplishing this recirculation, the invention is not limited thereto in that other means, well within the scope of the present invention, are possible.

If desired, it is also possible to utilize filtration means (not shown) as part of the recirculating pump and piping arrangement to remove any undesired contaminants or the like should these occur within the first fluid.

Figure 3:
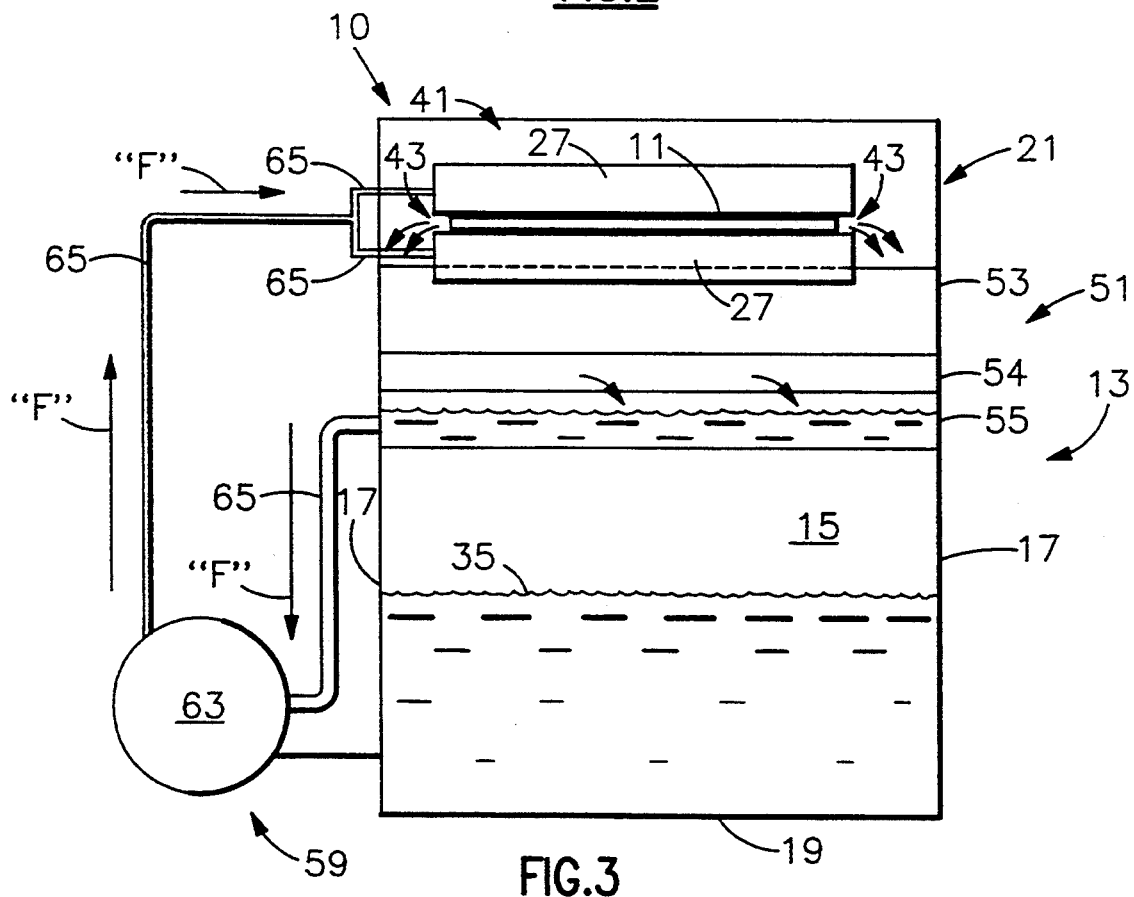
FIG. 3 is a side elevational view of the apparatus of FIG. 1, as taken along the line 3—3 in FIG. 1 and on a slightly reduced scale over the view in FIG. 1.

As shown in FIGS. 1 and 3, apparatus 10 further includes second fluid impingement means 41 for impinging a second fluid onto article 11. In one embodiment, two pairs of elongated fluid injector members 27, each preferably similar to injector members 27 of first fluid impingement means 23, are utilized. Thus, a total of four injector members 27, in two opposed pairs, would be utilized for this embodiment, to direct fluid onto the respective, adjacent surfaces of article 11 at the location substantially adjacent that within apparatus 10 where the first fluid strikes the article. In another embodiment (as shown), three pairs (six total) are used. As stated, each of the fluid injector members is preferably similar to those used for first impingement means 23, and thus similar to those described in copending application Ser. No. 07/911,610. It is also possible, as with the injector members in first means 23, to use alternative injectors, nozzles or the like, as mentioned above.

In FIG. 3, only one pair of such fluid injector members 27 is shown, it being understood that the remaining pairs are located directly therebehind. These fluid injector members are also of similar dimensions and spacings (e.g., from article 11) as those in first impingement means 23. As shown in FIG. 3, the second fluid directed onto article 11 passes out and downwardly at the opposed ends 43 of each pair.

A preferred second fluid for being impinged onto article 11 at this location within apparatus 10 is deionized water, said fluid serving to rinse any excess and/or undesired etchant remaining on the article as it passes through the part of housing 13 occupied by the pairs of fluid injector members of second fluid impingement means 41.

Although support means or the like for each of the shown fluid injector members of both first and second fluid impingement 23 and 41 are not shown, it is understood that such means are provided and are within the understanding of those skilled in the art. These may comprise such elements as clamps, braces, etc. Further description is thus not believed necessary.

As shown in the drawings, apparatus 10 further includes means for collecting the impinged second fluid within the same chamber 15 of housing 13 as used to collect the impinged first fluid. Surprisingly, both potentially diverse fluids are thus collected in close proximity to one another in such a singular chambered housing while still assuring substantial separation of these two fluids (except at noted below) to thus assure maximum fluid utilization for the invention.

Figure 4:
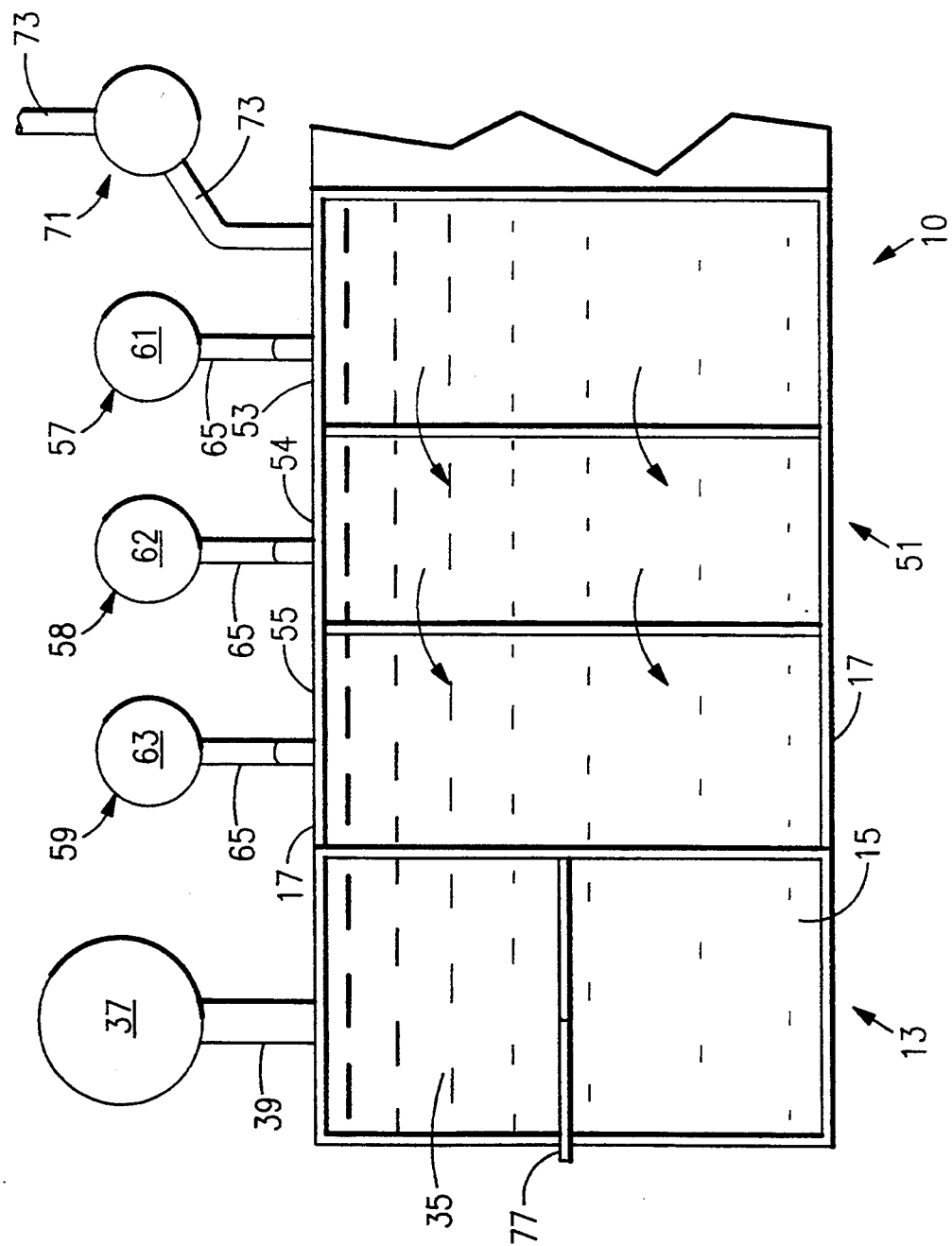
FIG. 4 is a top plan view of the apparatus of FIG. 1, as taken along the line 4—4 in FIG. I and on a slightly enlarged scale over the view in FIG. 1.

As shown in FIGS. 1-4, the preferred means for collecting the second fluid comprises a cascading sump 51 having a plurality (preferably three) of individual, tiered collecting chambers 53, 54 and 55. As shown in FIG. 1, each chamber of sump 51 is located below a respective pair of fluid injector members 27 used for second fluid impingement means 41. Thus, only two such chambers would be used for a second fluid impingement means using only two pairs of such injector members. As also shown, the fluid in chamber 53 is at a higher level than that of the succeeding chambers wherein the fluid levels are progressively lower. Thus, the respective vertical walls (56 and 56') adjacent chambers 53 and 54 include longitudinal slots 60 (FIG.. 1) for permitting second fluid overflow in the manner shown (with arrows) in FIG. 1. Circulation of second fluid from each of the chambers 53, 54 and 55 to respective impingement injector members is provided by individual circulation means 57, 58 and 59 respectively, as shown in FIG. 4. This circulation means thus serves to provide second fluid to the respective second fluid impingement means. Each of these circulation means, like that used for the invention's first fluid, comprises a pump (61, 62 and 63) and appropriate piping 65. The respective circulating means 59 shown in detail in FIG. 3 is understood to be substantially similar to means 57 and 58, this figure further including the direction of flow "F" for the recirculating second fluid. Part of one of these means (piping 65) is shown in FIG. 2 for consistency. Thus it is seen that the invention provides for recirculation of the collected second fluid from each of the respective chambers of the invention's cascading sump to thus assure a continuous rate of flow of such fluid to the respective second fluid impingement means. In a preferred embodiment of the invention, flow rates within the range of from about 0.5 to about 3.0 gallons per minute (GPM) were provided from each of the respective chambers 53, 54 and 55.

To assure second fluid overflow (cascading) as illustrated in FIG. 1, means 71 (FIG. 4) is used to provide fresh second fluid to the first container 53 of sump 51. Preferably, means 71 also comprises a pump and appropriate piping 73 coupled at one end to container 53 and at the other to a suitable source (not shown) of second fluid. Alternatively, means 71 may supply this fresh fluid directly to the injectors 27 over chamber 53. If second fluid is provided directly to chamber 53, circulation thereof to the respective injectors 27 (those over chamber 53) of second fluid impingement means 41 is provided by the aforementioned circulation means 57, which means 57 thereby forms part of the means for providing second fluid to impingement means 41. Regardless of which procedure is used, second fluid is continuously provided to such injectors during the operation of the invention. In a preferred embodiment to the invention, a total supply of only about one (1) GPM was provided by means 71 to the first chamber 53 (or injectors 27) thus assuring overflow into the second chamber 54 and thereafter into the third, lower chamber 55. Removal of excess second fluid collected in the lower, third chamber 55 of sump 51 is preferably accomplished by a suitable drain 77 (FIGS. 1, 2 and 4), for allowing the second fluid to exit housing 13 and possibly be collected at an appropriate, external location (not shown) for disposal, recycling, etc. Removal of the second fluid preferably occurs at a rate of about one (1) GPM, substantially similar to that rate of new second fluid being supplied sump chamber 51 (or to the injector members above this chamber).

Replenishment (provision) of second fluid to apparatus 10 in the manner prescribed is considered necessary due to the relatively minor mixing of the first fluid therewith, as occurs during operation of apparatus 10. Specifically, relatively minor amounts of such first fluid pass along with article 11 from the respective location of the invention's first impingement 21 into the portion of housing 13 occupied by the second fluid impingement means 41, whereupon such first fluid is then collected within one (e.g., chamber 55) or more of the respective chambers of sump 51. In the embodiment depicted in FIG. 1, using the described flow rates and a rate of travel of article 11 within the range of about one to about ten feet per minute (FPM), and while utilizing the described fluid injector members, relatively minor mixing (dragout) will occur within the third chamber 55. Accordingly, the invention provides a new and unique means for accommodating such minor mixing of two potentially diverse fluids while doing so in close proximity to one another and still accomplishing the effective treatment of an article passing through the invention.

In FIG. 5, there is shown a preferred embodiment of a means 81 for maintaining a quantity of the invention's first fluid (35') at a desired level above the respective surface of article 11 as the article passes in the shown direction. Means 81 preferably comprises a pair of roller assemblies 83, each located on opposite sides of the respective one of the fluid injector member 27. Each roller assembly preferably comprises two substantially vertically orientated rollers 85 which, as shown, are in contact with one another during the desired rotation ("R") of each. Further, the lower roller of each pair engages the respective upper surface of article 11 during article passage. Rollers 85 may be coupled to appropriate drive means (not shown) to effect rotation thereof and thus provide means for transporting article 11, if desired. Additionally, second, bottom rollers 87 are utilized, each contacting the respective opposite (lower) surface of article 11 and preferably aligned in the manner shown in FIG. 5. The first fluid being impinged on the article's lower surface is thus substantially prevented from passage into other parts of housing 13 by the combination of upwardly extending chamber walls (e.g., 56, 56', 56") to immediately below the respective bottom roller 87 and by the rollers 87, this impinged first fluid falling, via gravity, to be collected as shown in FIG. 1. Understandably, the first fluid collected at the level indicated in FIG. 5 also passes outwardly from the opposing ends of the upper fluid injector member 27, as shown in FIG. 2. Rollers 85 and 87 are not shown in FIGS. 2–4 for simplification purposes.

In the embodiment of FIG. 5, it is understood that the described roller action will not prevent relatively minor quantities of the impinged first fluid from passing (e.g., to the right in FIG. 5) to other parts of apparatus 10, and particularly to the location of the first pair of injectors members 27 of second fluid impingement means 41. Such relatively minor quantities of first fluid pass along the upper and lower surfaces of article 11 and are nearly substantially removed by the impinging second fluid from this first pair of injector members, whereupon both such combined fluids fall into the first chamber 55. Substantially all of the remaining first fluid which might pass through the first pair of injector members of means 41 is removed by the second injector members located adjacent thereto, such fluids then passing into the second chamber 54. Any minute amount of remaining first fluid is removed by the third pair of injectors. At the flow rates, distances and elements defined herein, approximately ninety-five percent of any first fluid, passing from the invention's first fluid impingement means, is removed by the first pair of injectors of the second means 41.

It is also possible in the present invention to provide alternative transport means (not shown) such that rollers 85 and 87 are, in effect, follower rollers which rotate by virtue of their respective engagement with article 11 during article movement. Uniquely, the invention is able to provide effective fluid treatment under both conditions.

As seen in FIG. 1, it is also possible to utilize the roller assemblies as shown in FIG. 5 for each of the respective pairs of fluid injector members 27 of second fluid impingement means 41 to thereby substantially maintain the impinging second fluid at prescribed levels along the upper surface of article 11 at these three locations.

Maintenance of the respective fluids at pre-established levels may be desired to create different fluid pressures at various impingement locations to thus assist in fluid retention at such locations, as desired. Understandably, this only occurs along the upper surfaces of article 11 relative to the adjacent impingement means thereover. For example, the fluid level 35' adjacent the injector 27 over chamber 54 may be desirably higher than the corresponding level of fluid above the injector 27 over chamber 55, to reduce both first and second fluid "dragout". Similarly, the level over chamber 55 may be higher than that adjacent the injector members of first fluid impingement means 23.

In addition to the rollers described above, it is also possible to use additional rollers, e.g., rollers 87', as needed. In one embodiment, four bottom rollers 87 were used between means 23 and 41.

As shown in FIG. 1, apparatus 10 further includes third fluid impingement means 91 (shown in phantom) for directing a third fluid onto article 11 after the article has exited from the second fluid impingement area. In one embodiment of the invention, this third fluid impingement means includes a pair of elongated fluid injector members 27, each of similar construction of those described above. One example of such a third fluid for being applied at this stage of the treatment of article 11 is air. Thus it is seen that the invention is capable of providing both liquids and gases onto moving article 11. Preferably, injectors 27 of means 91 are supplied fluid via appropriate piping (not shown) from a high pressure fan (vortex blower) 93, as shown. Alternatively, it is also possible to utilize fan 93 separately for directing the third fluid in the manner shown in phantom FIG. 1. Use off injectors 27 provided such fluid by fan 93, however, is preferred to assure such treatment in minimal spacing.

In FIG. 5, there are shown guide members 101 for engaging respective upper and lower surfaces of article 11 to thus maintain the article in proper orientation during its movement through apparatus 10. Each guide member thus slidably engages the respective adjacent surface of article 11 during such movement. In a preferred embodiment, each guide member 101 includes an engaging part 103 comprised of polyvinyl chloride (PVC) material. Each guide member may be adjustable to define an established spacing therebetween, depending on the relative thickness of the article being treated.

It is understood from the above that the invention is capable of treating solid articles such as the described substrate-circuitry articles described above. Additionally, and as shown in the representative example in FIG. 5, article 11 may include apertures 105 (e.g., PTH's) therein as typically found in many printed circuit boards. Uniquely, the invention is able to treat both types of such articles with fluids maintained at effective impinging forces needed to accomplish the desired treatments. In one embodiment, housing 13 had a height of about only three feet, a width of about only 3½ feet and a length (FIG. 1) of only about two feet. Thus, both the described cascading sumps and first fluid collection occurs in a relatively short overall transport distance (about two feet), further evidencing the compactness of design of the present invention.

Thus there has been shown and described a fluid treatment apparatus and method for effectively treating moving articles passing through the apparatus at an established rate. Treatment of articles using at least two fluids, each possibly having substantially different (and adverse) characteristics in a singular housing or the like, is readily possible. Further, such treatment is possible with maximum utilization of both fluids, and relatively minimal replenishment for at least one of such fluids. Uniquely, the invention is able to accomplish effective treatment using two potentially diverse fluids while enabling relatively minor mixing thereof in an acceptable manner.

While there have been shown and described what are at present considered the preferred embodiments of the invention, it will be obvious to those skilled in the art that various modifications and changes can be made therein without departing from the scope of the invention as defined by the appended claims. For example, it is possible, with slight modification, to use apparatus 10 for the purpose of electroplating metallic articles by placement of electrodes within the apparatus at appropriate locations relatively to the fluids being applied. It is further possible to position suitable heating elements (e.g., coils) within the apparatus, again at appropriate locations, if it is desired to raise the temperature of one or both of the fluids being applied. Still further, it is also possible to impart desired motion to apparatus 10 (e.g., through use of such devices as vibrators) to enhance the performance (e.g., increase speed and improve uniformity) of various operations. Additionally, it is also possible to position sensing devices (e.g., sonic, thermal) at appropriate locations within the apparatus to monitor selected activities near the article being treated. Other modifications and changes to the invention are, as stated above, readily possible without departing from the scope of the invention presented herein.

What is claimed is:

1. A method of treating an article with fluids, said method comprising:

transporting said article through a housing defining a chamber therein;

impinging a first fluid onto a surface of said article within said chamber;

collecting a major amount of said impinged first fluid within said chamber with a first collection means, a minor amount of said first fluid not being collected by said first collection means, said collected major amount occupying a first position within said chamber;

circulating said collected major amount of said first fluid to the means for impinging said first fluid onto said surface of said article and thereafter impinging said collected major amount of said first fluid onto said article;

impinging a second fluid onto said surface of said article at a location substantially adjacent said location of impingement of said first fluid using first and second fluid application members;

collecting said impinged second fluid and said minor amount of said first fluid within said chamber of said housing using a cascading sump means having first and second collecting chambers such that said collected second fluid and said minor amount of said first fluid will be positioned substantially vertically above said first position of said major amount of said first fluid and that the concentration of second fluid within said second collecting chamber will exceed the concentration of second fluid in said first collecting chamber will overflowing said fluid in said second collecting chamber into said first collecting chamber; and providing fresh amounts of said second fluid to the means for impinging said second fluid onto said surface of said article and thereafter impinging said fresh amounts of said second fluid onto said article.

2. The method according to claim 1 wherein said transporting of said article is accomplished by roller engagement of said article at predetermined locations on said article.

3. The method according to claim 1 wherein said impinging of said first fluid is accomplished using fluid jet injection.

4. The method according to claim 1 wherein said impinging of said second fluid is accomplished using fluid jet injection.

5. The method according to claim 2 further including removing predetermined quantities of said collected fluids within said first collecting chamber from said housing at a predetermined rate.

6. The method according to claim 5 wherein said fresh quantities of said second fluid provided said means for impinging said second fluid are supplied at a rate substantially similar to said predetermined rate of removing said collected fluids from said housing.

7. The method according to claim 1 further including the step of maintaining said first fluid at a predetermined level above the surface of said article in the area of said impinging of said first fluid.

8. The method according to claim 7 further including the step of maintaining said second fluid at a predetermined level above said surface of said article in the area of said impinging of said second fluid.

9. The method according to claim 1 further including the step of impinging a third fluid onto said article at a location substantially adjacent the location of impingement of said second fluid.

10. A fluid treatment apparatus for applying first and second fluids to an article passing therethrough, said apparatus comprising:

a housing defining a chamber therein;

first fluid impingement means within said housing for impinging a first fluid onto a surface of said article;

first means for collecting a major amount of said first fluid impinged on said article within said chamber of said housing, a minor amount of said fluid not be collected within said chamber by said first means for collecting, said collected major amount occupying a first position within said chamber;

means for circulating said collected major amount of said first fluid to said first fluid impingement means;

second fluid impingement means including first and second fluid application members within said housing for impinging a second fluid onto said surface of said article at a location substantially adjacent the location of impingement of said first fluid;

cascading sump means including first and second collecting chambers for collecting said impinged second fluid within said chamber of said housing such that said collected second fluid will be positioned substantially vertically above said collected major portion of said first fluid, said first collecting chamber collecting said second fluid impinged on said article by said first fluid application member of said second fluid impingement means and further collecting substantially all of said minor amount of said first fluid not collected by said first means for collecting such that said first collecting chamber will include a mixture of both of said first and second fluids with said second fluid being at a first concentration level, said second collecting chamber collecting said second fluid impinged on said article by said second fluid application member and further adapted for collecting part of said minor amount of said first fluid not collected by said first collecting chamber such that the concentration of second fluid within said second collecting chamber will be greater than said first concentration and the fluid level in said second collecting chamber will be greater than the fluid level in said first collecting chamber, causing part of the fluid in said second collecting chamber to overflow into said first collecting chamber;

means for circulating said fluids collected in said first and second collecting chambers to said first and second fluid application members, respectively; and means for providing fresh amounts of said second fluid to said second fluid application member of said second fluid impingement means.

11. The fluid treatment apparatus according to claim 1 wherein said means for providing said fresh amounts of said second fluid to said second fluid application member provides said fresh amounts directly to said second collecting chamber, said means for circulating said fluids circulating said fresh amounts to said second fluid application member.

12. The fluid treatment apparatus according to claim 2 wherein said means for circulating said collected fluids to said first and second fluid application members comprises a pair of pumps.

13. The fluid treatment apparatus according to claim 1 further including means for removing predetermined quantities of said collected fluids from said first collecting chamber of said cascading sump means of said apparatus at a pre-established rate.

14. The fluid treatment apparatus according to claim 13 wherein said means for removing said predetermined quantities of said collected fluids from said apparatus comprises a drain.

15. The fluid treatment apparatus according to claim 1 wherein said means for providing said fresh amounts of said second fluid to said second fluid application member of said second fluid impingement means comprises a pump.

16. The fluid treatment apparatus according to claim 1 wherein said first fluid impingement means comprises at least one elongated fluid injector member.

17. The fluid treatment apparatus according to claim 16 wherein said fluid injector member of said first fluid impingement means includes at least two rows of fluid jet injectors therein.

18. The fluid treatment apparatus according to claim 1 wherein said first and second fluid application members of said second fluid impingement means each comprises at least one elongated fluid injector member.

19. The fluid treatment apparatus according to claim 18 wherein each of said fluid injector members of said second fluid impingement means includes at least two rows of fluid jet injectors therein.

20. The fluid treatment apparatus according to claim 1 wherein said means for circulating said major amount of said collected first fluid to said first fluid impingement means comprises a pump.

21. The fluid treatment apparatus according to claim 1 wherein said cascading sump means comprises three separate collecting chambers.

22. The fluid treatment apparatus according to claim 21 further including means for removing predetermined quantities of said collected fluids from said apparatus at a preestablished rate, said removing means including a drain connected to said first collecting chamber.

23. The fluid treatment apparatus according to claim 20 wherein said means for providing said fresh amounts of said second fluid to said second fluid impingement means provides said fresh amounts of said second fluid at a predetermined rate substantially similar to said pre-established rate of removal of said collected fluids.

24. The fluid treatment apparatus according to claim 1 further including means for maintaining a quantity of said first fluid at an established level above said surface of said article in the area substantially adjacent said means for impinging said first fluid onto said surface of said article.

25. The fluid treatment apparatus according to claim 24 wherein said means for maintaining said quantity of said first fluid at said established level comprises at least two roller assemblies, each of said assemblies being spacedly located on opposite sides of said means for impinging said first fluid.

26. The fluid treatment apparatus according to claim 25 wherein at least one of said roller assemblies comprises two substantially vertically oriented rollers, a first of said rollers engaging said surface of said article and a second of said rollers engaging said first roller.

27. The fluid treatment apparatus according to claim 24 further including means for maintaining a quantity of said second fluid at an established level above said surface of said article in the area substantially adjacent said means for impinging said second fluid onto said surface of said article.

28. The fluid treatment apparatus according to claim 27 wherein said means for maintaining said quantity of said second fluid at said established level comprises at least two roller assemblies, each of said assemblies being spacedly located on opposite sides of said means for impinging said second fluid.

29. The fluid treatment apparatus according to claim 28 wherein at least one of said roller assemblies comprises two substantially vertically oriented rollers, a first of said rollers engaging said surface of said article and a second of said rollers engaging said first roller.

30. The fluid treatment apparatus according to claim 1 further including third fluid impingement means for impinging a third fluid onto said article at a location substantially adjacent the location of impingement of said second fluid.

31. The fluid treatment apparatus according to claim 30 wherein said third fluid is air and said means for impinging said third fluid comprises a fan.

32. The fluid treatment apparatus according to claim 1 wherein said first fluid is an etchant and said second fluid is water.

33. The fluid treatment apparatus according to claim 1 further including guide means located within said housing for slidably engaging said article within said housing to maintain said article in proper orientation during movement of said article through said apparatus.

34. The fluid treatment apparatus according to claim 23 wherein said guide means is adjustable.

35. The fluid treatment apparatus according to claim 1 further including at least one roller located below said article relative to said first fluid impingement means, said first and second collecting chambers having at least one upstanding wall, said wall extending upwardly from said chambers to immediately below said roller, said roller and said upstanding wall substantially preventing said first fluid impinged on the bottom surface of said article from passing into said collecting chambers.

* * * * *